(12) United States Patent
Choi

(10) Patent No.: US 6,500,708 B2
(45) Date of Patent: Dec. 31, 2002

(54) METHOD FOR FORMING CAPACITOR OF SEMICONDUCTOR DEVICE

(75) Inventor: Hyung Bok Choi, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/114,252

(22) Filed: Apr. 3, 2002

(65) Prior Publication Data

US 2002/0146850 A1 Oct. 10, 2002

(30) Foreign Application Priority Data

Apr. 18, 2001 (KR) ........................................ 2001-20741

(51) Int. Cl.[7] ......................................... H01L 21/8242
(52) U.S. Cl. ............................. 438/253; 438/3; 438/678
(58) Field of Search ............................. 438/3, 238–240, 438/250–256, 381, 393–399, 678

(56) References Cited

U.S. PATENT DOCUMENTS

| 5,380,673 A | 1/1995 | Yang et al. |
| 5,899,725 A | 5/1999 | Harshfield |
| 6,140,693 A | 10/2000 | Weng et al. |
| 6,372,574 B1 * | 4/2002 | Lane et al. .................. 438/244 |

* cited by examiner

Primary Examiner—Jey Tsai
(74) Attorney, Agent, or Firm—Morgan, Lewis & Bockius LLP

(57) ABSTRACT

A method for forming a capacitor of a semiconductor device prevents loss of a storage node from occurring during an isolation process between cells of the storage node, thereby obtaining a sufficient height of the storage node. The method includes the steps of forming a first insulating film on a substrate, the first insulating film having a contact hole; forming a conductive layer within the contact hole; forming a seed metal layer on the first insulating film and the conductive layer; forming a second insulating film on the seed metal layer; selectively etching the second insulating film to form a lower electrode formation region; forming a lower electrode formation material layer in the lower electrode formation region using the seed metal layer, the lower electrode formation material layer having a height lower than a surface of the second insulating film; forming a passivation film on the lower electrode formation material layer; and removing the second insulating film and portions of seed metal layer using the passivation film as a mask.

18 Claims, 5 Drawing Sheets

METHOD FOR FORMING CAPACITOR OF SEMICONDUCTOR DEVICE

The present invention claims the benefit of Korean Patent Application No. 2001-20741 filed in Korea on Apr. 18, 2001, which is hereby incorporated by reference.

BACKGROUND OF THE INVENTION

1. Field of the Invention

The present invention relates to a method for fabricating a semiconductor memory device, and more particularly, to a method for forming a capacitor of a semiconductor memory device.

2. Background of the Related Art

A related art method for forming a capacitor of a semiconductor device will be described with reference to the accompanying drawings. FIGS. 1A to 1C are sectional views illustrating related art process steps of forming a capacitor of a semiconductor device. FIGS. 2A and 2B are images showing a decrease in height of a storage node during etch-back of a seed metal layer in the related art.

In a process for fabricating a DRAM capacitor using an electro-chemical deposition (ECD) process, after a platinum (Pt) storage node is formed by Pt deposition, an isolation process of a storage node is performed by a Pt dry etch-back process. A related art isolation process of a storage node in forming a related art capacitor will be described below.

As shown in FIG. 1A, an insulating film 1 and a surface anti-reflecting film 2 are sequentially formed on a semiconductor substrate (not shown) in which a cell transistor (not shown) is formed. A contact hole is formed to connect a capacitor with one electrode of the cell transistor.

A doped polysilicon layer is deposited within the contact hole by a chemical vapor deposition (CVD) process. The doped polysilicon layer is then etched back to form a recess portion so that a plug layer 3 is formed. A low resistance contact film 4 and a barrier film 5 are formed in the recess portion to reduce contact resistance between the plug layer 3 and the barrier film 5 which will be formed later.

The low resistance contact film 4 is formed by depositing a material such as titanium (Ti) on silicon (Si), annealing the result to form $TiSi_x$, and removing some of Ti that is not reacted with Si.

The barrier film 5 is then formed on an entire surface including a portion where the low resistance contact film 4 is formed. The barrier film 5 is planarized to remain on the low resistance contact film 4.

Subsequently, Pt is deposited on the entire surface to form a first metal layer 6 used as a seed layer. A dummy insulating film 7 for patterning of a storage node is then formed on the entire surface. The dummy insulating film 7 is selectively etched by a photolithographic process so that a storage node formation region (lower electrode of a capacitor) is defined.

Next, a second metal layer 8 is formed using the first metal layer 6 exposed in the storage node formation region (i.e., in a portion where the dummy insulating film 7 is removed) as a seed layer. The second metal layer 8 is formed using the ECD process.

As shown in FIG. 1B, the dummy insulating film 7 is removed by a wet deep-out process and the first metal layer 6 other than the storage node formation region is removed by a dry etch-back process.

However, in this case, since the first metal layer 6 used as a seed layer is dry etched without using a photo mask, the storage node 9 is also etched. For this reason, insufficient height of the storage node 9 is obtained. As a result, the height of the storage node decreases from a height (A) of FIG. 1B to a height (B) of FIG. 1C.

Decreased height of the storage node is shown in FIGS. 2A and 2B. Here, FIG. 2A is an image after deposition of the second metal layer 8 for forming the storage node by the ECD process, and FIG. 2B is an image after wet deep-out of the dummy insulating film 7 and etch-back of the first metal layer 6 used as a seed layer. Referring to FIG. 2B, it is noted that the storage node height is significantly decreased as loss of the storage node is seriously generated.

However, the related art method for forming a capacitor of a semiconductor device has several problems. For example, since a Pt seed layer is dry etched without using a mask when the storage node is formed after depositing Pt by the ECD process, an area of the lower electrode is reduced, thereby reducing dielectric capacitance of the BST capacitor. As a result, efficiency of the capacitor is reduced.

SUMMARY OF THE INVENTION

Accordingly, the present invention is directed to a method for forming a capacitor of a semiconductor device that substantially obviates one or more of the problems due to limitations and disadvantages of the related art.

An object of the present invention is to provide a method for forming a capacitor of a semiconductor device that prevents loss of a storage node during an isolation process between cells of the storage node, thereby obtaining a sufficient height of the storage node.

Another object of the present invention is to provide a method for forming a semiconductor device having good capacitance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming capacitor of a semiconductor device the steps of forming a first insulating film on a substrate, the first insulating film having a contact hole; forming a conductive layer within the contact hole; forming a seed metal layer on the first insulating film and the conductive layer; forming a second insulating film on the seed metal layer; selectively etching the second insulating film to form a lower electrode formation region; forming a lower electrode formation material layer in the lower electrode formation region using the seed metal layer, the lower electrode formation a material layer having a height lower than a surface of the second insulating film; forming a passivation film on the lower electrode formation material layer; and removing the second insulating film and portions of the seed metal layer using the passivation film as a mask.

In another aspect, a method for forming a capacitor of a semiconductor device includes the steps of the steps of sequentially forming an insulating film and a surface anti-reflecting film on a surface of a semiconductor substrate including a cell transistor; selectively etching the insulating film and the surface anti-reflecting film to form a contact hole; sequentially forming a plug layer, a low resistance contact film, and a barrier film within the contact hole; depositing Pt on the anti-reflecting film and the barrier film to form a first metal layer used as a seed layer; forming a dummy insulating film on the first metal layer and selectively etching the dummy insulating film to form a lower electrode formation region; depositing Pt in the electrode formation region by an ECD process using the exposed first metal layer as a seed layer to form a second metal layer; depositing TiN on at least the second metal layer and planarizing the TiN to remain at a height substantially equal to an upper surface of the dummy insulating film so that a passivation film is formed; removing the dummy insulating film and portions of the first metal layer to form a lower electrode; depositing BST on the entire surface to form a dielectric film; crystallizing the dielectric film; and depositing Pt on the dielectric film and selectively patterning the Pt to form an upper electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3A to 3I are sectional views of a process of forming a capacitor of a semiconductor device according to the present invention. As will be explained, loss of a storage node is prevented during an isolation process between cells of the storage node, thereby obtaining a sufficient height of the storage node. To achieve this result, a TiN film used as a hard mask is deposited before a deep-out process of a dummy insulating film, and a chemical mechanical polishing (CMP) process is performed to place the TiN film on the storage node.

In the present invention, a Pt seed dry etch-back process is performed after the deep-out process of the dummy insulating film. Then, an isolation process of the storage node can be performed in a state that etching of the ECD Pt storage node is prevented.

The process of forming a capacitor of a semiconductor according to the present invention will be described in detail below.

Figure 1A:
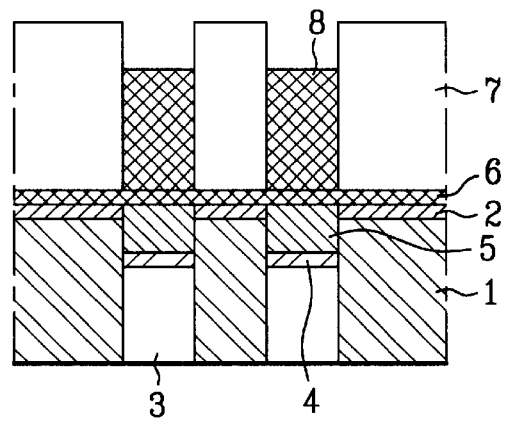
FIGS. 1A to 1C are sectional views illustrating a related art process for forming a capacitor of a semiconductor device.
Figure 1B:
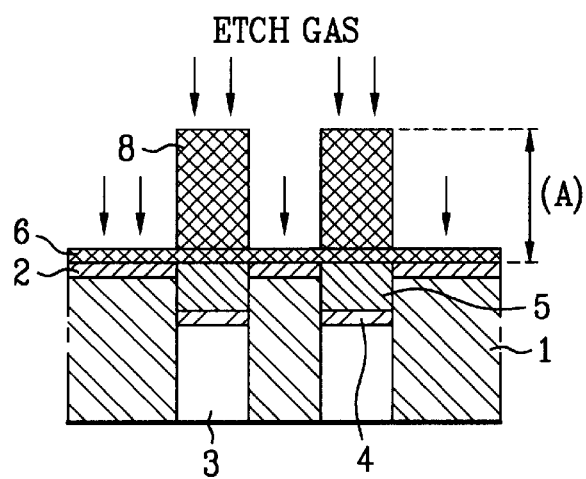
Figure 1C:
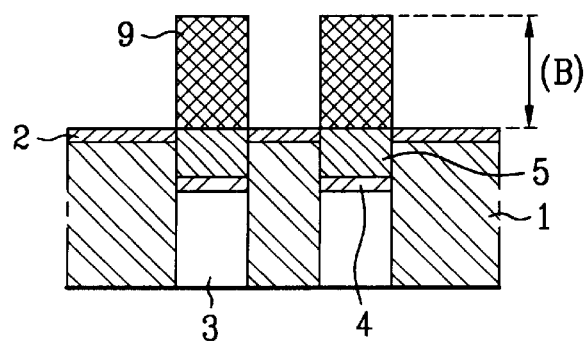
Figure 2A:
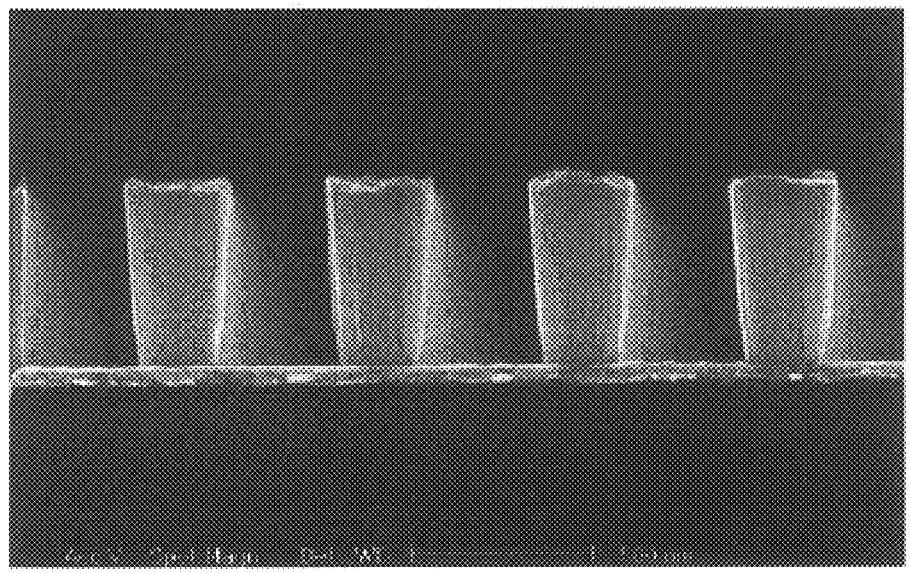
FIGS. 2A and 2B are images showing a decrease in the height of a storage node during etch-back of a seed metal layer in the related art.
Figure 2B:
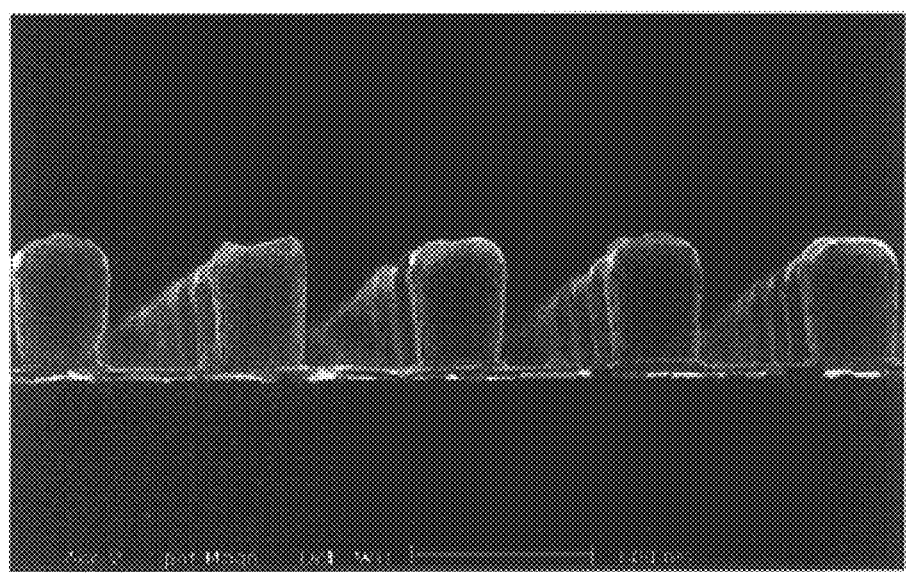
Figure 3A:
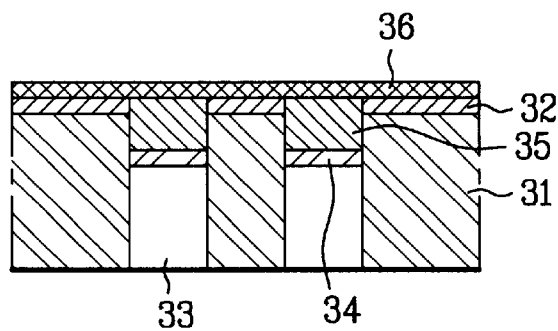
FIGS. 3A to 3I are sectional views of a process of forming a capacitor of a semiconductor device according to the present invention.

As shown in FIG. 3A, an insulating film 31 and a surface anti-reflecting film 32 are sequentially formed on a semiconductor substrate (not shown) in which a cell transistor (not shown) is formed. A contact hole is formed to connect a capacitor with one electrode of the cell transistor. The insulating film 31 is formed of an oxide film while the surface anti-reflecting film 32 is formed of a material having high etching selectivity, e.g., a nitride film, at a thickness of 300~1000 Å.

A process for forming a conductive layer within the contact hole will now be described.

First, a doped polysilicon layer is deposited within the contact hole by a CVD process. The doped polysilicon layer is then etched back to form a recess portion, so that a plug layer 33 is formed. The recess portion has a depth of 500~1500 Å.

Subsequently, a low resistance contact film 34 and a barrier film 35 are formed in the recess portion, thereby reducing contact resistance between the plug layer 33 and the barrier film 35 which will be formed later. The low resistance contact film 34 is formed so that a material such as titatium (Ti) is deposited on silicon (Si) as a thickness of 100~300 Å, for example, and annealed by a rapid thermal process (RTP) to form $TiSi_x$. Then, some of the Ti that did not react with the Si is removed.

The barrier film 35 is formed such that TiN or a three-component based diffusion barrier film (e.g., TiSiN, TiAlN, TaSiN, or TaAlN) is deposited on the entire surface including the low resistance contact film 34 by a physical vapor deposition (PVD) or CVD process. The barrier film 35 is then planarized by a CMP process so as to remain on the low resistance contact film 34.

Next, Pt is deposited on the entire surface at a thickness of 50~1000 Å to form a first metal layer 36 used as a seed layer. Any one of Ru, Ir, Os, W, Mo, Co, Ni, Au, and Ag with excellent etching characteristics may be used as the first metal layer 36.

Figure 3B:
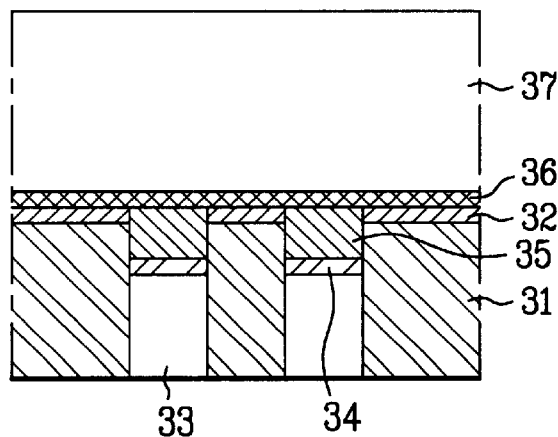
Figure 3C:
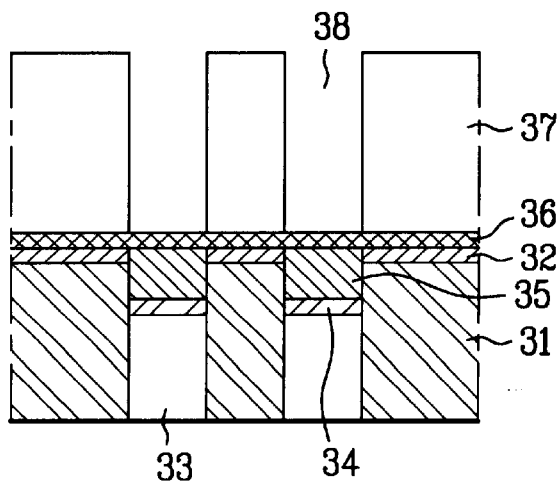

As shown in FIG. 3B, a dummy insulating film 37 for patterning a storage node is then formed on the entire surface with a thickness of 5000~1000 Å. The dummy insulating film 37 is preferably formed of a photoresist or a CVD oxide film. The dummy insulating film 37 is then selectively etched, thereby forming a lower electrode formation region 38 as shown in FIG. 3C.

Figure 3D:
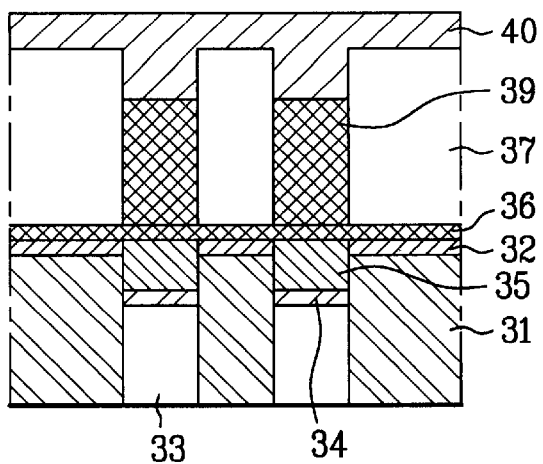

Subsequently, as shown in FIG. 3D, after a pre-cleaning process for deposition of a Pt layer using an ECD process is performed, a second metal layer 39 is formed using the first metal layer 36 exposed in the storage node formation region 38 (i.e., in a portion where the dummy insulating film 37 is removed) as a seed layer. The second metal layer 39 is formed by the ECD process. Current density during the ECD process is preferably maintained within a range of 0.1~10 mA/cm² using DC power, pulse power, or reverse pulse power. The second metal layer 39 is formed in the lower electrode formation region 38 at a height lower than an upper surface of the dummy insulating film 37. A material layer for forming a passivation film 40, such as a metal nitride layer, preferably a refractory metal nitride layer, and more preferably a TiN, is formed having a thickness of 50~10000 Å.

Figure 3E:
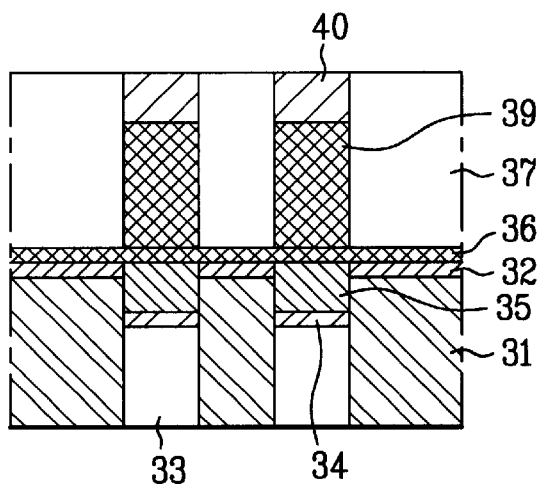

As shown in FIG. 3E, a passivation film 40 is formed at a height substantially equal to an upper surface of the dummy insulating film 37 by the CMP process. A material such as TiN, WN, or Ti that can be removed by a wet cleaning process is preferably used as the passivation film 40.

Figure 3F:
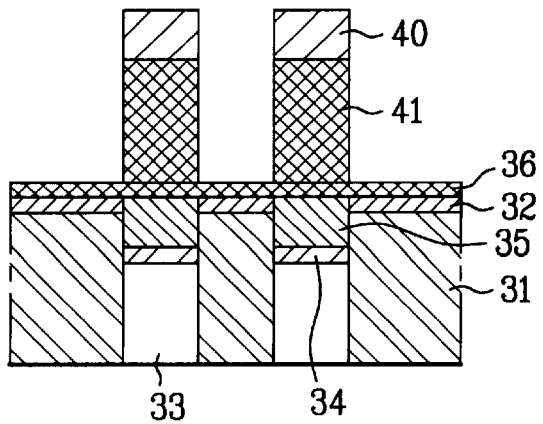
Figure 3G:
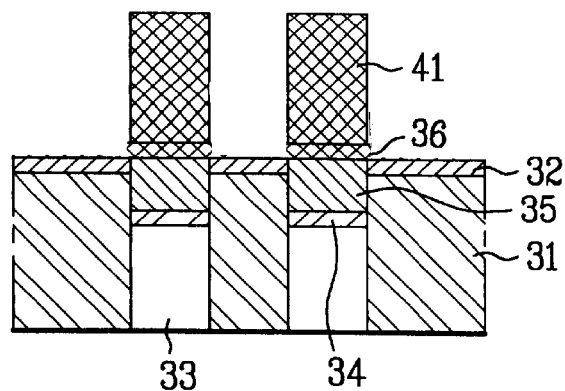

In this state, as shown in FIG. 3F, the dummy insulating film 37 is removed by a wet deep-out process. The wet deep-out process may be performed using either HF or a mixing solution BF/NH$_4$F. As shown in FIG. 3G, after an exposed portion of the first metal layer 36 is removed by a dry etch-back process, the passivation film 40 is removed by a dry etching process to form a lower electrode 41.

Figure 3H:
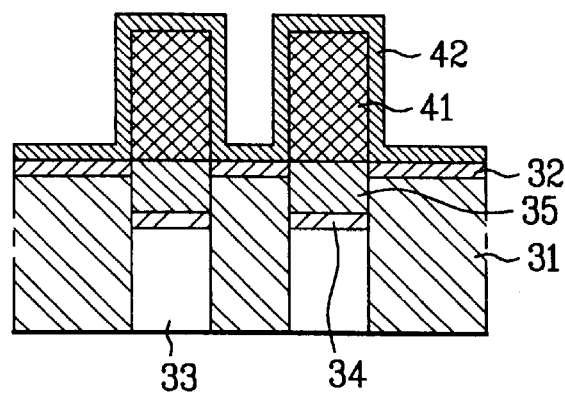

As shown in FIG. 3H, a high dielectric material, e.g, BST, is deposited on the entire surface with a thickness of 150~500 Å by a CVD process within the range of 400~600° C., for example, to form a dielectric film 42. Subsequently, the dielectric film 42 is crystallized by the RTP process for 30~180 seconds under ambient conditions of nitrogen at 500~700° C.

Figure 3I:
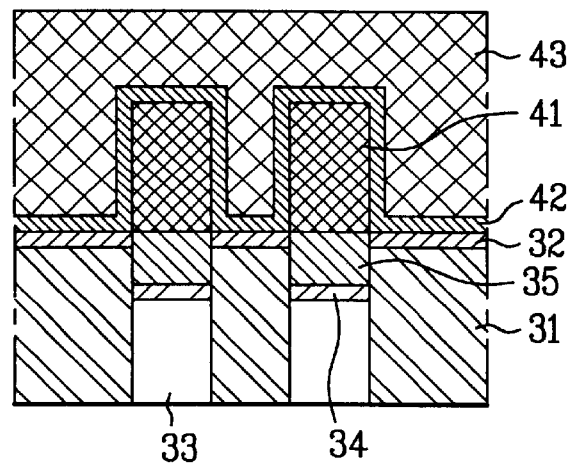

As shown in FIG. 3I, Pt is deposited on the dielectric film 42 by the CVD process and then selectively patterned to form an upper electrode 43.

In the aforementioned process for forming a capacitor according to the present invention, sufficient capacitance can be obtained by reducing loss of the storage node layer during an isolation process of the storage node. Thus, it is not necessary to design a storage node at a large area considering loss that may occur. As a result, the method for forming a capacitor of a semiconductor device according to the present invention has a number of advantages. For example, loss of the storage node is reduced during the isolation process of the storage node. In this case, sufficient height of the storage node can be obtained, thereby increasing capacitance per cell. Further, since uniform height of the storage node can be obtained, no difference in capacitance between cells occurs. Also, since it is possible to reduce a storage node formation area, capacitance required for each cell in a device having a size of 010 μm or less can be obtained and facility of design can be obtained.

It will be apparent to those skilled in the art that various modifications and variations can be made in the method for forming capacitor of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a capacitor of a semiconductor device, comprising the steps of:
    forming a first insulating film on a substrate, the first insulating film having a contact hole;
    forming a conductive layer within the contact hole;
    forming a seed metal layer on the first insulating film and the conductive layer;
    forming a second insulating film on the seed metal layer;
    selectively etching the second insulating film to form a lower electrode formation region;
    forming a lower electrode formation material layer in the lower electrode formation region using the seed metal layer, the lower electrode formation material layer having a height lower than a surface of the second insulating film;
    forming a passivation film on the lower electrode formation material layer; and
    removing the second insulating film and portions of the seed metal layer using the passivation film as a mask.

2. The method according to claim 1, wherein the lower electrode formation region at least partially overlaps the conductive layer.

3. The method according to claim 1, wherein the conductive layer is formed within the contact hole by sequentially depositing a plug layer, a low resistance contact film, and a barrier film.

4. The method according to claim 1, further comprising a step of forming a surface anti-reflecting film having high etching selectivity on a surface of the first insulating film with a thickness of 300~1000 Å.

5. The method according to claim 1, wherein the seed metal layer is formed at a thickness of 50~1000 Å using any one of Pt, Ru, Ir, Os, W, Mo, Co, Ni, Au, and Ag.

6. The method according to claim 1, wherein the second insulating film is formed of one of a photoresist and a CVD oxide film.

7. The method according to claim 1, wherein the lower electrode formation material layer is formed by an ECD process after a pre-cleaning process for deposition of the lower electrode formation material layer.

8. The method according to claim 7, wherein the ECD process is performed in such a manner that current density is within the range of 0.1~10 mA/cm$^2$ using one of DC power, pulse power and reverse pulse power.

9. The method according to claim 1, wherein the passivation film is formed of any one of TiN, WN and Ti, and is planarized at a height substantially equal to an upper surface of the second insulating film by a CMP process.

10. The method according to claim 1, wherein the second insulating film is removed by a wet deep-out process using one of HF and a mixing solution of HF/NH$_4$F.

11. A method for forming a capacitor of a semiconductor device, comprising the steps of:
    sequentially forming an insulating film and a surface anti-reflecting film on a surface of a semiconductor substrate including a cell transistor;
    selectively etching the insulating film and the surface anti-reflecting film to form a contact hole;
    sequentially forming a plug layer, a low resistance contact film, and a barrier film within the contact hole;
    depositing Pt on the anti-reflecting film and the barrier film to form a first metal layer used as a seed layer;
    forming a dummy insulating film on the first metal layer and selectively etching the dummy insulating film to form a lower electrode formation region;
    depositing Pt in the electrode formation region by an ECD process using the exposed first metal layer as a seed layer to form a second metal layer;
    depositing TiN on at least the second metal layer and planarizing the TiN to remain at a height substantially equal to the same as an upper surface of the dummy insulating film so that a passivation film is formed;
    removing the dummy insulating film and portions of the first metal layer to form a lower electrode;
    depositing BST on the entire surface to form a dielectric film;
    crystallizing the dielectric film; and
    depositing Pt on the dielectric film and selectively patterning the Pt to form an upper electrode.

12. The method according to claim 11, wherein the plug layer is formed such that a doped polysilicon layer is deposited within the contact hole by a CVD process and then etched back to form a recess portion having a depth of 500~1500 Å at an upper portion of the contact hole.

13. The method according to claim 11, wherein the low resistance contact film is formed in such a manner that Ti is deposited on Si at a thickness of 100~300 Å and annealed to form TiSi$_x$, and some of the Ti which is not reacted with the Si is removed by a wet etching process.

14. The method according to claim 11, wherein the barrier film is formed such that any one of TiN, TiSiN, TiAlN, TaSiN, and TaAlN is deposited on the low resistance contact film and the anti-reflecting film by one of a PVD and a CVD process and then planarized to remain on the low resistance contact film by a CMP process.

15. The method according to claim 11, wherein the dielectric film is formed by a CVD process at a thickness of 150~500 Å within a temperature range of 400~600° C.

16. The method according to claim 11, wherein the dielectric film is crystallized by an RTP process for 30~180 sec under ambient conditions of nitrogen between 500° C. and 700° C.

17. The method according to claim 11, wherein the Pt for forming the upper electrode is deposited by the CVD process.

18. The method according to claim 11, wherein the second metal layer is formed in the lower electrode formation region at a height lower than an upper surface of the dummy insulating film.

* * * * *